United States Patent [19]
Bouthillier

[11] Patent Number: 5,777,400
[45] Date of Patent: Jul. 7, 1998

[54] SHIELDED COMPUTER NETWORK SWITCH

[76] Inventor: Stephen W. Bouthillier, 1263 Primrose St., Ridgecrest, Calif. 93555

[21] Appl. No.: 687,102

[22] Filed: Jul. 22, 1996

[51] Int. Cl.⁶ .................................................. H01B 7/34
[52] U.S. Cl. ...................... 307/91; 174/35 GC; 361/212
[58] Field of Search .................. 307/89–91; 200/304, 200/305; 174/35 R, 35 GC, 35 MS, 5 R, 5 SG; 361/816, 818, 212, 220; 379/451; 370/401

[56] References Cited

U.S. PATENT DOCUMENTS

| | | | |
|---|---|---|---|
| 4,647,714 | 3/1987 | Goto | 174/35 R |
| 5,283,710 | 2/1994 | Hamilton et al. | 361/212 |
| 5,454,037 | 9/1995 | Pacella | 379/451 |
| 5,595,801 | 1/1997 | Fahy et al. | 174/35 R |

*Primary Examiner*—Richard T. Elms
*Attorney, Agent, or Firm*—Melvin J. Sliwka; Stephen J. Church

[57] ABSTRACT

A secure computer network switch, wherein a network switch is enclosed in a material which not only reflects electromagnetic waves but also absorbs them. This arrangement keeps all network signals confined to the switch enclosure and prevents electromagnetic radiation from the network cable connections. This allows a single computer to have access to multiple networks without vulnerability to theft or unauthorized disclosure of data between the networks.

4 Claims, 2 Drawing Sheets

SECTION 4-4

SECTION 5-5

SHIELDED COMPUTER NETWORK SWITCH

BACKGROUND OF THE INVENTION

Field of the Invention

With the development of multiple computer networks, the users currently face the problem of theft or inadvertent disclosure of sensitive information. If more than one network is simultaneously connected to a single computer the user faces the problem of how to separate and protect the information found on each network. The electromagnetic radiation of signals from one network switch and its associated wiring, can radiate to a second network switch and is retrievable by sophisticated techniques. For example, a typical user having access to a nonsecure wide area network, and a secure or internal local area network is vulnerable to sophisticated computer "hackers", unless he is physically connected to only one network at a time. This involves physically connecting and disconnecting cables. It is a time consuming process and can cause damage to either the cable connectors or to the connector on the computer itself.

The current technology attempts to contain or reflect Radio Frequency(RF) and/or Electromagnetic Interference (EMI) signals. Network switches currently designed for containment/reflection are costly and do not entirely eliminate the risk of emanating signal cross talk. There are literally hundreds of computer network switches which cover a multitude of computer cable connector configurations for accessing multiple computer networks. However, none can reliably assure the user that cross talk or exploitable emanations/electronic carrier signals could not be detected in other positions located on the same switch. Nor could they assure that such exploitable signals cannot be detected on an adjacent switching mechanism collocated in the same switch box. The invention described below is a cost effective means of eliminating the risk of cross talk or exploitable emanations/electronic carrier signals both inside and outside the switch box.

SUMMARY OF THE INVENTION

The present invention utilizes absorption methodology and unique grounding techniques to substantially enhance computer network security. A cost effective non-woven absorption/reflection fabric is used to effectively reduce or eliminate the risk of cross talk or exploitable/electronic carrier wave signals both inside and outside the switch cabinet. That is, between the secure and nonsecure network connection ports.

OBJECTS AND ADVANTAGES

It is an object of the present invention to provide a mechanical switch to which two computer networks can be attached without the risk of cross talk or exploitable electronic wave emanations.

It is another object of the invention to have a switch box having multiple switches, attached to multiple computer networks, without the risk of cross talk or exploitable electronic wave emanations.

It is an advantage of the present invention that the elimination of cross talk and exploitable emanations is accomplished by employing not only reflective but also absorption methodology.

It is another advantage of the present invention that the absorption methodology is accomplished by using a non-woven conductive material.

It is another advantage of the present invention to enhance the effectiveness of the nonwoven conductive material by using effective grounding techniques.

DETAILED DESCRIPTION OF THE INVENTION

The present invention resides in the new and novel use of a known material which provides unexpected results. The material is made by the International Paper Corporation, and is sold under the trade name of "Saf'n'Shield" (herein called conductive fabric). This material is a non-woven conductive fabric made by randomly arranging fibers rather than weaving them, and pressing them with a binder agent. The fibers are made of nickel-coated graphite which can attenuate electromagnetic signals of frequencies up to 40 giga-hertz by over 100 decibels. The material is made in the form of wallpaper and used to create rooms which are electromagnetically "silent". The normal use of this material is not to contain electromagnetic emanations within the space it encloses but to prevent external emanations from entering the enclosed space. Also, in its normal uses, the spaces enclosed are usually quite large. Typically a room is enclosed so that sensitive electromagnetic measurements can be taken from equipment in the room. These measurements cannot be done outside of the room do to the normal high level of ambient electromagnetic waves.

In the present invention the material is used not to keep electromagnetic waves out, but to contain the electromagnetic emanations within a very confined space. In the preferred embodiment of the invention the confined space is generally cylindrical one to two inches in diameter, and six inches or less in length. Exact dimensions are determined by the type of switch and switch box selected, and are not critical to the operation of the invention. Also, the input and output cables are electrically grounded to the conductive fabric, resulting in over a three fold increase in the absorption/reflective capabilities of the conductive fabric. This grounding technique is contrary to the fabric manufactures instructions on how to improve the fabrics attenuation characteristics. The manufacturer suggests improving the attenuation characteristics by using multiple layers of the material but makes no suggestion as to additional grounding.

Preferred Embodiment

Figure 1:
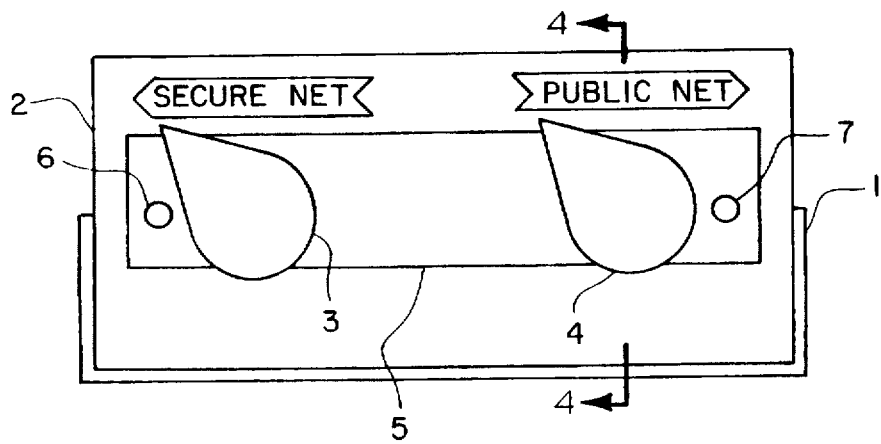
FIG. 1 is a front view of the switch box.

Referring to FIG. 1, a front view of the network switch can be seen. The switch includes a box 1, and a front plate 2 made of any suitable nonconductive material, in the present case the box and face plate are a high impact plastic. Mount on the face plate 2 are switch assemblies 24 and 25, along with rectangular conductive fabric pieces 16 and 17 (see FIG. 3). Switch control knobs 3, and 4, interlocking bar 5, and position indicators 6, and 7 are also seen in FIG. 1. The interlocking bar 5 is mechanically attached to switch knobs 3 and, 4, such that when switch 3 is moved to the "on" position, i.e. connected to the secure computer network, it forces switch 4 to move to its "off" position and vice versa. The position indicators 6 and, 7 are holes in the locking rod 5, through which an appropriate bright color can be seen when the switch is in the "on" position. In the instant case the box 1 is black and when the switch 3 in moved to the "on" position a bright green color is displayed in position indicator hole 6, and the color shown in indicator hole 7 is black. When switch 4 is in it's "on" position, i.e. connected to the nonsecure public computer network, a bright red color appears in the indicator hole 7, and a black color appears in indicator hole 6. The green color indicates that the computer is hooked up to the secure network, and the red color indicates the computer is hooked up to the nonsecure public network.

Figure 2:
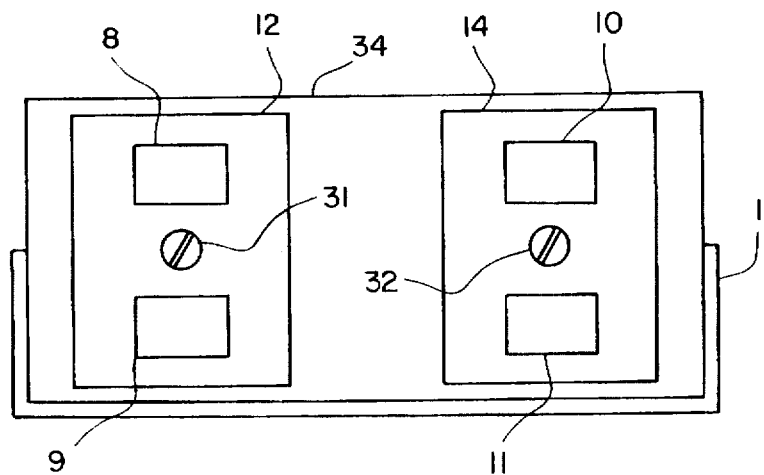
FIG. 2 is a rear view of the switch box having four connectors.
Figure 4:
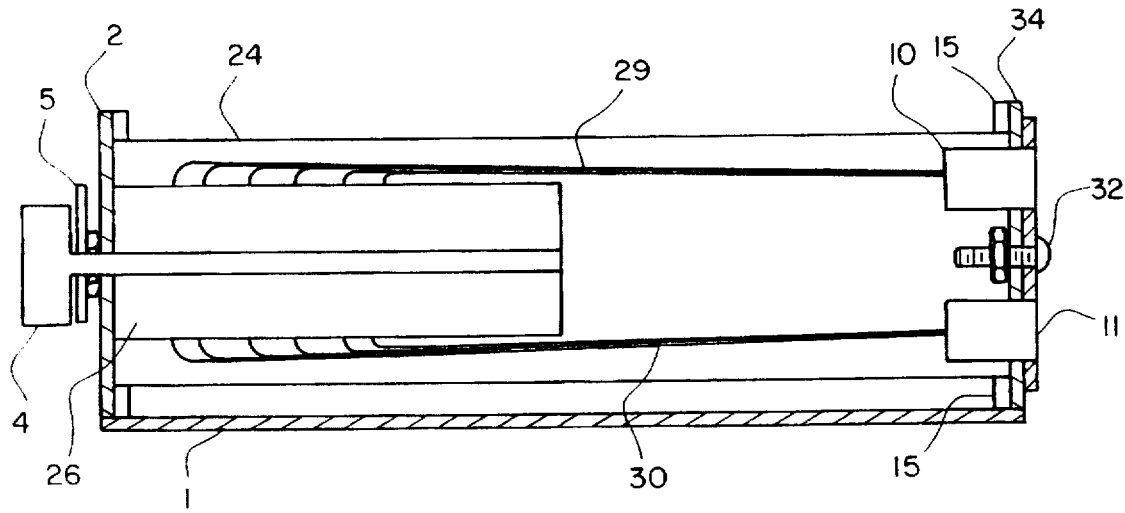
FIG. 4 is a cut away longitudinal view of the inside of one of the switch assembly cylinders.

FIG. 2 is a rear view of the network switch box 1, showing the back plate 34 on which is mounted the input connectors 8 and 10, and the output connectors 9 and 11. These connectors can be of any type depending on the type of cabling used on the particular networks and/or computers. On both faces of the back plate 34 are also mounted square pieces of the conductive fabric 12 and 14, and 13 and 15. Grounding connections 31 an 32 consist of two screws to which are attached the input and output cable shields. Also these grounding screws electrically connect the conductive fabric squares 12 and 14, and 13 and 15, respectively. This grounding produced the unexpected result of increasing the attenuation capabilities of the conductive fibers by three fold.

Figure 3:
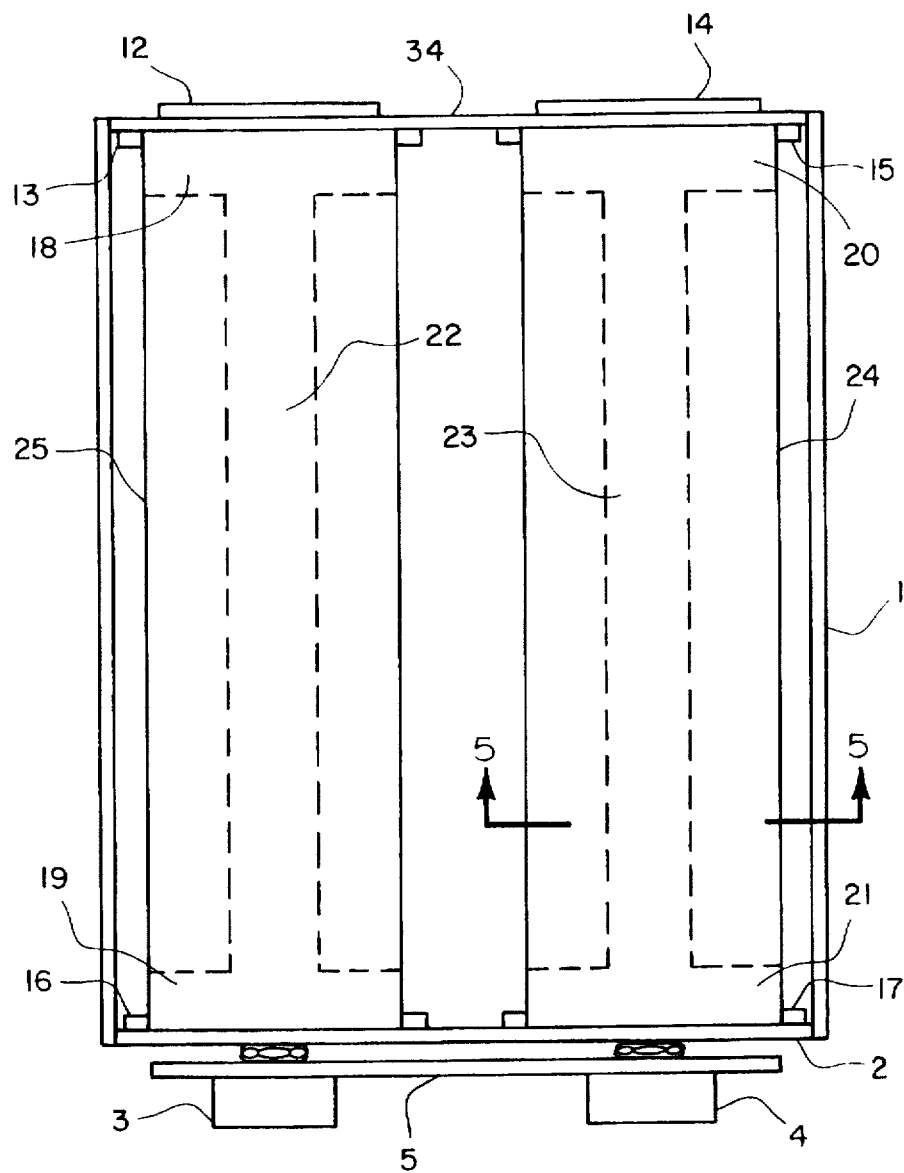
FIG. 3 is a top view of the open switch box.
Figure 5:
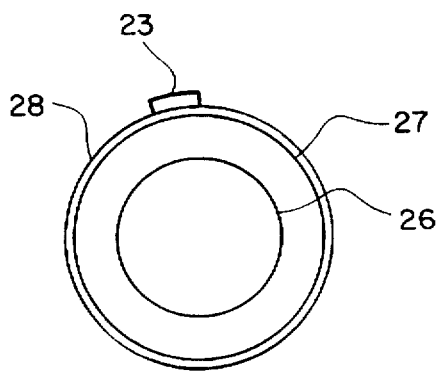
FIG. 5 is a cross sectional view of one of the switch assembly cylinders.

FIG. 3 is a top view of the interior of box 1. It shows two switch assembly cylinders 24 and 25, which are made of card board tubes with the conductive fabric wrapped around them. Any nonconductive material could be used to perform the mechanical function of holding the conductive fabric in the proper position as well as preventing it from electrically shorting out the switch connections. FIG. 5 shows a cross section of cylinder 24, showing the switch 26, the card board support 27 and the conductive fabric wrap 28. The wrap is overlapped slightly and sealed with an electrically conductive tap 23. As seen in FIG. 3, the conductive tape 23 runs the length of the cylinder 24, and additional strips of conductive tape 20 and 21 surround the edges of the cylinder conductively attaching it to the square pieces of the conductive fabric 15 and 17. Thus cylinder 24 is covered and electrically sealed along its length as well as at its ends. The switch 26 and its connecting cables 29 and 30 are entirely surrounded by the conductive fiber material, and any electromagnetic emanations will be absorbed by the conductive fiber. Cylinder 25 is constructed in a similar fashion.

Tests for cross talk have been completed and have shown the described configuration to have an attenuation of greater than 80 db in the 200 kHz to 300 kHz frequency range, and over 60 db in the 20 hz to 30 hz frequency range. This is far superior to conventional network switches and the computer network switch of the present invention is the only network switch to be approved by the Department of Defense as meeting the National Communication Security Memorandum (NACSIM) 5203 security requirements.

It is realized that obvious modifications can be made to the details of construction of this network switch without departing from the spirit of the invention. For example, another possible configuration, not shown, could be to use a single multiple layer switch to connect and disconnect the two computer networks. This single switch would be surrounded by a single cylinder of the conductive fiber material, but divided into two compartment to achieve the isolation desired.

What is claimed is:

1. A secure network switch assembly comprising;

means for mounting at least one multi-layer electrical switch capable of alternately connecting and disconnecting a first and second computer network to a computer;

means for electromagnetically isolating said first computer network from said second computer network;

said isolating means further comprising a conductive non-woven fabric material capable of absorbing as well as reflecting electromagnetic waves;

said mounting means further comprising a nonconductive box having a front mounting plate and a rear mounting plate;

said nonconductive box is made of a high impact plastic;

said front mounting plate having an inner surface which is covered by said conductive non-woven fabric and has at least one multi-layer electrical switch mounted thereon;

said rear mounting plate having an inner and outer surface both surfaces being covered by said conductive non-woven fabric and having at least two electrical connectors mounted thereon;

said rear mounting plate further comprises means for effectively grounding and electrically connecting said conductive non-woven fabrics on its inner and outer surfaces;

said grounding and electrical connection of said inner and outer surfaces of conductive non-woven fabric is accomplished by a metallic nut and bolt extending through said rear mounting plate and said conductive non-woven fabric;

said multi-layer electrical switch is encased in the conductive non-woven fabric;

said fabric is mechanically supported by a nonconductive cylindrical tube positioned between said conductive non-woven fabric and said switch.

2. A secure network switch assembly as defined in claim 1 wherein said conductive non-woven fabric is electrically sealed along its length by conductive sealing means.

3. A secure network switch assembly as defined in claim 2 wherein said conductive non-woven fabric is electrically sealed at its ends to said surface of conductive non-woven fabric by conductive sealing means.

4. A secure network switch assembly as defined in claim 3 which comprises two multi-layer electrical switch assemblies.

* * * * *